(12) United States Patent  (10) Patent No.: US 9,000,832 B1
Lin  (45) Date of Patent: Apr. 7, 2015

(54) SWITCH

(71) Applicants: Hep Tech Co., Ltd., Taichung (TW); Ming-Feng Lin, Taichung (TW)

(72) Inventor: Ming-Feng Lin, Taichung (TW)

(73) Assignees: Hep Tech Co., Ltd., Taichung (TW); Ming-Feng Lin, Taichung (TW)

( * ) Notice: Subject to any disclaimer, the term of this patent is extended or adjusted under 35 U.S.C. 154(b) by 0 days.

(21) Appl. No.: 14/465,100

(22) Filed: Aug. 21, 2014

(30) Foreign Application Priority Data

Sep. 16, 2013 (TW) .............................. 102133500 A

(51) Int. Cl.
*H03K 17/72* (2006.01)
*H03K 17/66* (2006.01)

(52) U.S. Cl.
CPC ...... *H03K 17/663* (2013.01); *H03K 2217/0036* (2013.01); *H03K 2217/0009* (2013.01)

(58) Field of Classification Search
None
See application file for complete search history.

(56) References Cited

U.S. PATENT DOCUMENTS

| | | | | |
|---|---|---|---|---|
| 3,902,079 A | * | 8/1975 | Ahmed | 327/214 |
| 4,430,580 A | * | 2/1984 | Lovelace | 327/214 |
| 5,719,733 A | * | 2/1998 | Wei et al. | 361/56 |
| 6,015,992 A | * | 1/2000 | Chatterjee et al. | 257/350 |
| 2010/0027173 A1 | * | 2/2010 | Wijmeersch | 361/56 |
| 2011/0257807 A1 | * | 10/2011 | Seo et al. | 700/295 |

* cited by examiner

*Primary Examiner* — Cassandra Cox
(74) *Attorney, Agent, or Firm* — Ming Chow; Sinorica, LLC

(57) ABSTRACT

A switch includes a first switching member and a latch circuit. A first terminal of the first switching member is electrically connected to a power source, while a second terminal thereof is electrically connected to a loading. The latch circuit includes a first transistor and a second transistor which are mutually electrically connected. The first transistor is electrically connected to the first terminal, and the second transistor is electrically connected to the control terminal. By inputting a trigger voltage to the second transistor, the second transistor and the first switching member are conducted, which makes the first transistor become conductive. After the first transistor becoming conductive, the first transistor provides electricity to the second transistor to cause latching effect, and to consequently keep the first switching member conductive.

10 Claims, 7 Drawing Sheets

US 9,000,832 B1

SWITCH

The current application claims a foreign priority to the patent application of Taiwan No. 102133500 filed on Sep. 16, 2013.

BACKGROUND OF THE INVENTION

1. Technical Field

The present invention relates generally to switches, and more particularly to a switch which is energy efficient.

2. Description of Related Art

Between a power source and a loading, there is typically a switch installed to allow or disallow electricity to flow through. Conventionally, a switch may adopt a silicon controlled rectifier (SCR) for unidirectional conduction, or a triode for alternating current (TRIAC) for bidirectional conduction. Take SCR for example, the electricity provided by the power source is allowed to flow to the loading when the SCR is conducted. Though, after the SCR starts conducting current, the current consumed by the loading has to be maintained higher than the holding current of the SCR, otherwise the SCR becomes nonconducting, and the electricity is then cut off as a result.

SCRs can operate normally if applied to conventional illumination devices which use a tungsten filament to emit light, because the current consumed by a tungsten filament is always higher than the holding current of a SCR while illuminating. But since light-emitting diode (LED) consumes much less current than tungsten filament, which is also much less than the holding current of a SCR, LED illumination devices are usually provided with a pseudo loading circuit, which consumes additional current to keep the SCR working. However, pseudo loading circuit performs no function other than consuming energy, and it still consumes energy even when LED is turned off, which is unnecessary and wasteful. If the holding current of a switch can be effectively reduced, a LED illumination device would no longer need to be provided with a pseudo loading circuit. It is obvious to see that such device would be more energy-economical, and its manufacturing cost would be less, too. In addition, the trigger current required for a SCR or a TRIAC to conduct current is higher than tens of mA, and since energy-saving has become a key topic nowadays, it would be preferable to find a way to lower the required trigger current.

BRIEF SUMMARY OF THE INVENTION

In view of the above, the primary objective of the present invention is to provide a switch, which requires less energy to operate.

The present invention provides a switch provided between a power source and a loading, which includes a first switching member and a latch circuit. The first switching member has a first terminal, a second terminal, and a control terminal, wherein the first terminal is electrically connected to the power source, and the second terminal is electrically connected to the loading; the control terminal controls conduction between the first terminal and the second terminal; the latch circuit includes a first transistor and a second transistor which are electrically connected to each other, wherein the first transistor is electrically connected to the first terminal of the first switching member, and the second transistor is electrically connected to the control terminal of the first switching member. When a trigger voltage is provided to the second transistor, the second transistor and the first switching member are conducted to make the first transistor conductive; after the first transistor becoming conductive, the first transistor provides electricity to the second transistor, which keeps the second transistor conductive.

Whereby, the switch could reduce unnecessary consumption of energy.

BRIEF DESCRIPTION OF THE SEVERAL VIEWS OF THE DRAWINGS

The present invention will be best understood by referring to the following detailed description of some illustrative embodiments in conjunction with the accompanying drawings, in which.

DETAILED DESCRIPTION OF THE INVENTION

Figure 1:
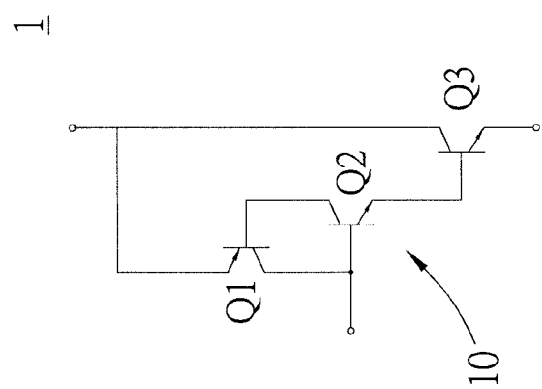
FIG. 1 is a circuit of a first preferred embodiment of the present invention.

As shown in FIG. 1, a switch 1 of the first preferred embodiment of the present invention, which is adapted to be installed between a power source (not shown) and a loading (not shown), includes a latch circuit 10 and a switching member, wherein the latch circuit 10 can be triggered to turn on the switching member, and electricity provided by the power source can be allowed or disallowed to flow to the loading in this way.

The latch circuit 10 includes a first transistor Q1 and a second transistor Q2, wherein the first transistor Q1 is a PNP bipolar junction transistor, and the second transistor Q2 is a NPN bipolar junction transistor in the first preferred embodiment. The switching member is a transistor (third transistor Q3), which is also a NPN bipolar junction transistor.

A collector of the third transistor Q3 (i.e., a first terminal of the switching member) electrically connects the power source and an emitter of the first transistor Q1, while an emitter of the third transistor Q3 (i.e., a second terminal of the switching member) is electrically connected to the loading, and a base of the third transistor Q3 (i.e., a control terminal of the switching member) is electrically connected to an emitter of the second transistor Q2. At the same time, a base of the first transistor Q1 is electrically connected to a collector of the second transistor Q2, and a collector of the first transistor Q1 is electrically connected to a base of the second transistor Q2. The base of the second transistor Q2 accepts a trigger voltage.

With the aforementioned circuit structure, when the power source provides positive voltage, and the trigger voltage inputted into the base of the second transistor Q2 is higher than a total amount of voltage at the bases and the emitters of the second transistor Q2 and the third transistor Q3, the second transistor Q2 and the third transistor Q3 conduct to allow the electricity provided by the power source to flow to the loading. Meanwhile, the collector of the second transistor Q2 draws current from the base of the first transistor Q1, which makes the first transistor Q1 conductive. Once the first transistor Q1 is conducted, the collector of the first transistor Q1 provides current to the base of the second transistor Q2 to keep the second transistor Q2 conductive. Whereby, the first transistor Q1 and the second transistor Q2 has latching effect, which keeps the third transistor Q3 conductive (between the collector and the emitter thereof) even when the trigger voltage is lower than the total amount of the voltage at the bases and the emitters of the second transistor Q2 and the third transistor Q3. As a result, the switch 1 performs the same function with a SCR.

Figure 2:
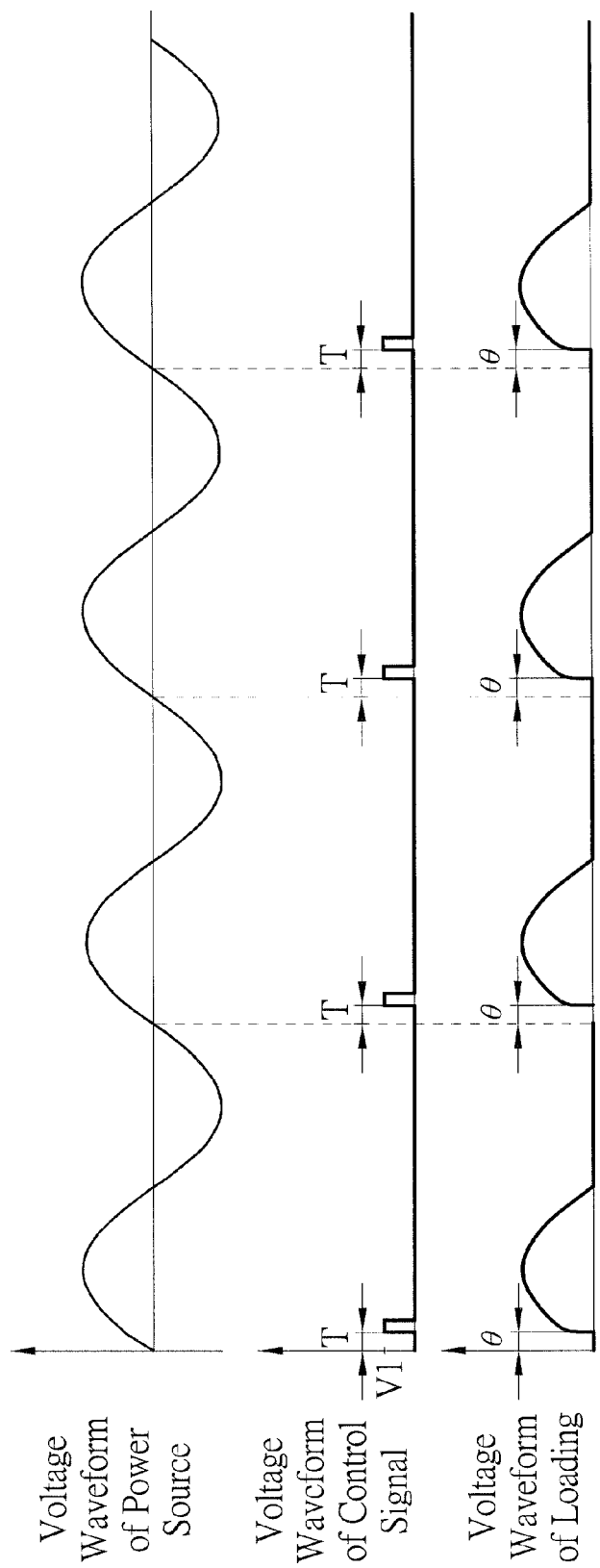
FIG. 2 is an oscillogram showing that the voltage waveform of the loading has delay angels due to the switch of the first preferred embodiment of the present invention.

As shown in FIG. 2, if the power source is an alternative current (AC) power source, by inputting a control signal which has the same level with the trigger voltage V1 to the base of the second transistor Q2 at a predetermined time T after a voltage waveform of the power source passing a zero crossing of each positive half cycle, the third transistor Q3 becomes conductive; even if a voltage level of the control signal is zero, the third transistor Q3 is still conductive, unless the voltage of the power source drops to zero. In this way, a voltage waveform of the loading provided from the emitter of the third transistor Q3 has a delay angle 8 in each positive half cycle, and the delay angle 8 can be modified by change a length of the predetermined time T.

It is worth mentioning that, since the third transistor Q3 is kept conductive by the first transistor Q1 and the second transistor Q2 after the second transistor Q2 is triggered and before the voltage of the power source passing the zero crossing, the voltage of the power source doesn't automatically cut off when the positive half cycle approaching the zero crossing. In other words, unlike general SCRs, current consumed by the loading is not necessary to be maintained higher than a holding current. Therefore, even if the loading connected to the third transistor Q3 consumes very low current, the third transistor Q3 can be still conductive and allows the electricity to flow to the loading.

In practice, the first transistor Q1 and the second transistor Q2 can be small signal transistors which only require working current of microamperes, and the third transistor Q3 can be a power transistor. In this way, current of the control signal inputted to the second transistor Q2 can be only several microamperes, and it is already sufficient to trigger the third transistor Q3 and to consequently make it conductive; no additional amplifier circuit needed to amplify the current of the control signal. Therefore, the switch 1 provided in the present invention is much more energy-economical than conventional SCRs.

Figure 3:
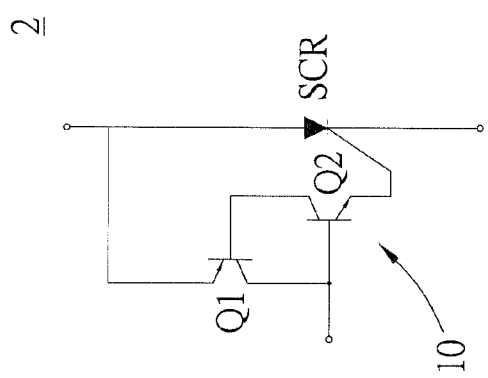
FIG. 3 is a circuit of a second preferred embodiment of the present invention.

As shown in FIG. 3, a switch 2 of the second preferred embodiment of the present invention has basically the same structure with that of the first preferred embodiment, except that the switching member is a SCR instead. With a latch circuit 10 formed by the first transistor Q1 and the second transistor Q2 which are small signal transistors, the current of the control signal inputted to the base of the second transistor Q2 only needs to be several microamperes to trigger the SCR and to consequently make it conductive.

Figure 4:
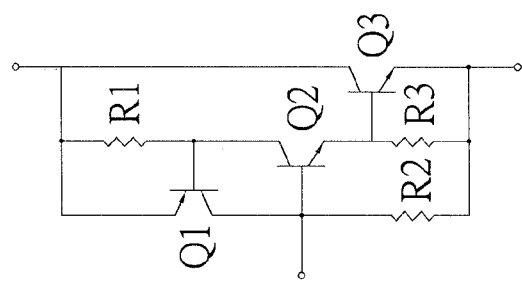
FIG. 4 is a circuit of a third preferred embodiment of the present invention.
Figure 5:
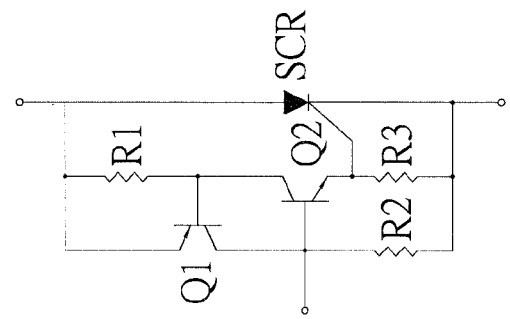
FIG. 5 is a circuit of a fourth preferred embodiment of the present invention.

The third and the fourth preferred embodiments are respectively shown in FIG. 4 and FIG. 5, wherein the switch of each said embodiments is provided with three resistors R1-R3 to perform the same function with the first and the second preferred embodiments. More specifically, the design of the third preferred embodiment is based on the first preferred embodiment, while the fourth preferred embodiment is based on the second preferred embodiment.

Figure 6:
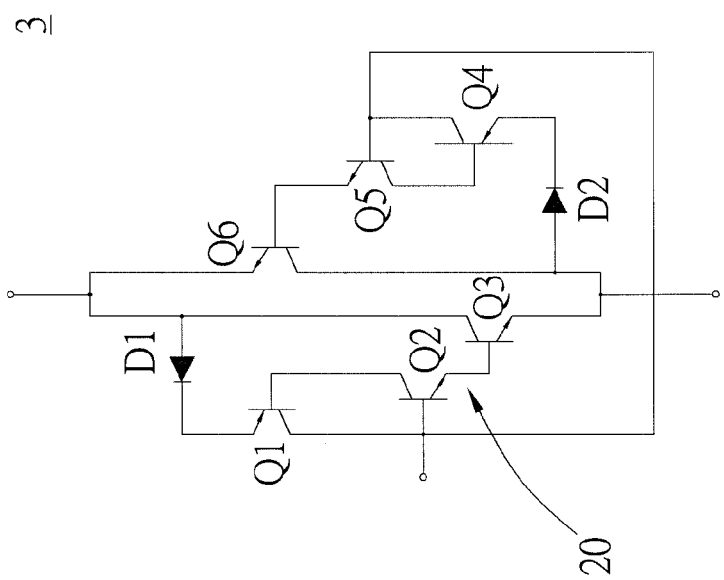
FIG. 6 is a circuit of a fifth preferred embodiment of the present invention.

In the aforementioned preferred embodiments, the switch is unidirectional conductive; a switch 3 of the fifth preferred embodiment which performs the function of bidirectional conduction is shown in FIG. 6, which is also based on the first preferred embodiment. In addition to a first switching member which is the third transistor Q3 as an example, a second switching member which is a sixth transistor Q6 as an example is further provided. Moreover, in addition to the first transistor Q1 and the second transistor Q2, a latch circuit 20 further includes a fourth transistor Q4 and a fifth transistor Q5 which are electrically connected to each other to control conduction of the sixth transistor Q6. The switch 3 of the fifth preferred embodiment further includes a first diode D1 and a second diode D2 to prevent reverse conduction.

The sixth transistor Q6 and the third transistor Q3 have the same structure. The emitter of the sixth transistor Q6 (i.e., a second terminal of the second switching member) is electrically connected to the collector of the third transistor Q3, while the collector of the sixth transistor Q6 (i.e., a first terminal of the second switching member) is electrically connected to the emitter of the third transistor Q3. The connection and operation between the first transistor Q1, the second transistor Q2, and the third transistor Q3 are basically the same with that of the first preferred embodiment, except that the first transistor Q1 is electrically connected to the collector of the third transistor Q3 through the first diode D1. On the other hand, the connection between the fourth transistor Q4, the fifth transistor Q5, the sixth transistor Q6, and the second diode D2 is also the same with that between the first transistor Q1, the second transistor Q2, the third transistor Q3, and the first diode D1. The base of the second transistor Q2 is electrically connected to a base of the fifth transistor Q5 to accept the trigger voltage.

When the power source provides positive voltage, inputting the trigger voltage conducts the second transistor Q2 and the third transistor Q3; when the power source provides negative voltage, inputting the trigger voltage conducts the fifth transistor Q5 and the sixth transistor Q6, and the fourth transistor Q4 and the fifth transistor Q5 have latching effect to keep the sixth transistor Q6 conductive, wherein the trigger voltage is higher than or equal to the total amount of voltage at the bases and the emitters of the second transistor Q2 and the third transistor Q3, and the trigger voltage is also higher than or equal to the total amount of voltage at the bases and the emitters of the fifth transistor Q5 and the sixth transistor Q6.

Figure 7:
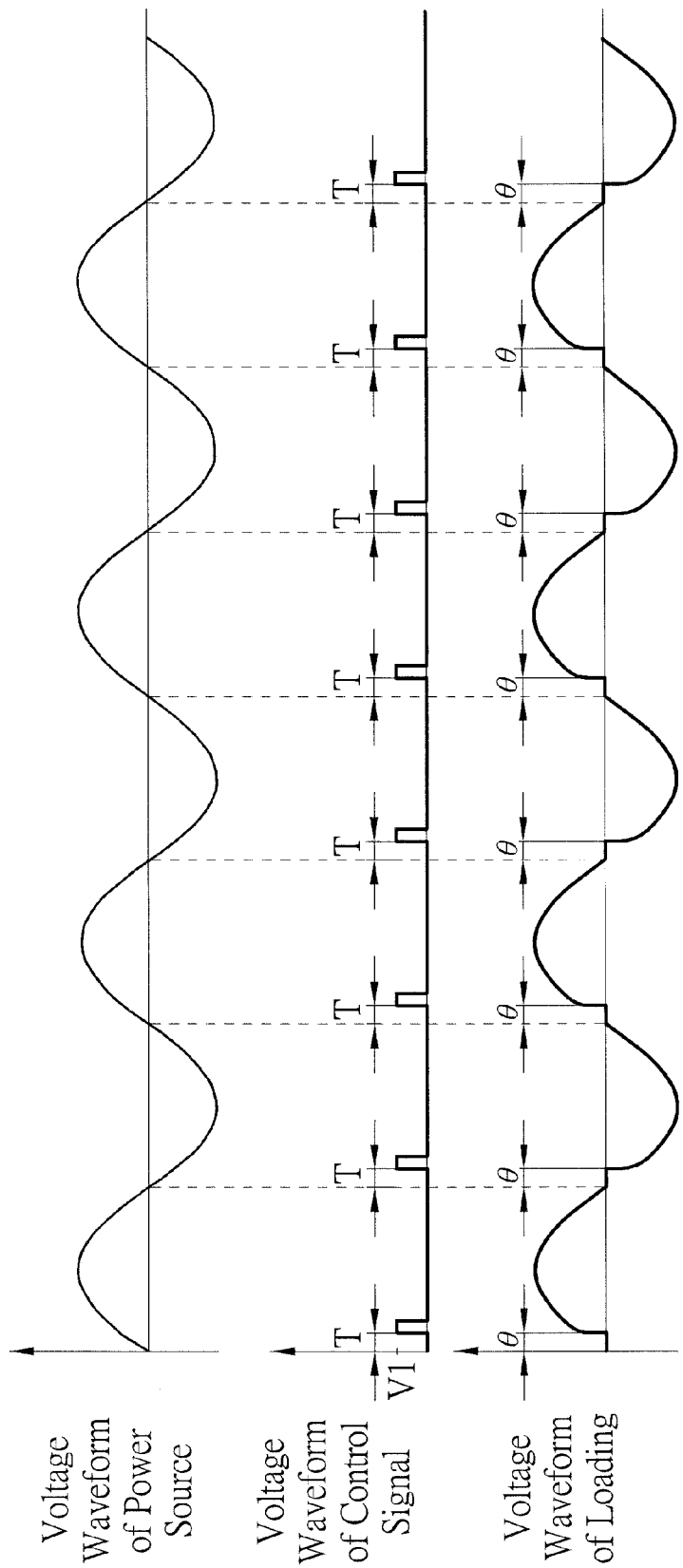
FIG. 7 is an oscillogram showing that the voltage waveform of the loading has delay angels due to the switch of the fifth preferred embodiment of the present invention.

As shown in FIG. 7, if the power source connected to the collector of the third transistor Q3 is an AC power source, by inputting a control signal which has the same level with the trigger voltage V1 to the base of the second transistor Q2 at a predetermined time T after a voltage waveform of the power source passing a zero crossing of each positive half cycle, the second transistor Q2 and the third transistor Q3 become conductive. On the contrary, if the control signal is inputted at the predetermined time T after the voltage waveform of the power source passing a zero crossing of each negative half cycle, the fifth transistor Q5 and the sixth transistor Q6 becomes conductive. In this way, the voltage waveform provided from the emitter of the third transistor Q3 to the loading has a delay angle θ in each positive and negative half cycle. Whereby, the switch 3 performs bidirectional conduction as a TRIAC.

Similarly, the delay angle θ can be modified by changing a length of the predetermined time T. The switch 3 provided in the present invention does not require the current consumed by the loading to be maintained higher than a holding current, and even if the loading consumes very low current, the third transistor Q3 or the sixth transistor Q6 can be still conductive to allow the electricity to flow to the loading. In addition, the first transistor Q1, the second transistor Q2, the fourth transistor Q4, and the fifth transistor Q5 can be small signal transistors which only require working current of several microamperes, and in such case, current of the control signal inputted to the second transistor Q2 only has to be several microamperes to trigger the third transistor Q3 and the sixth transistor Q6, and to consequently make them conductive.

Figure 8:
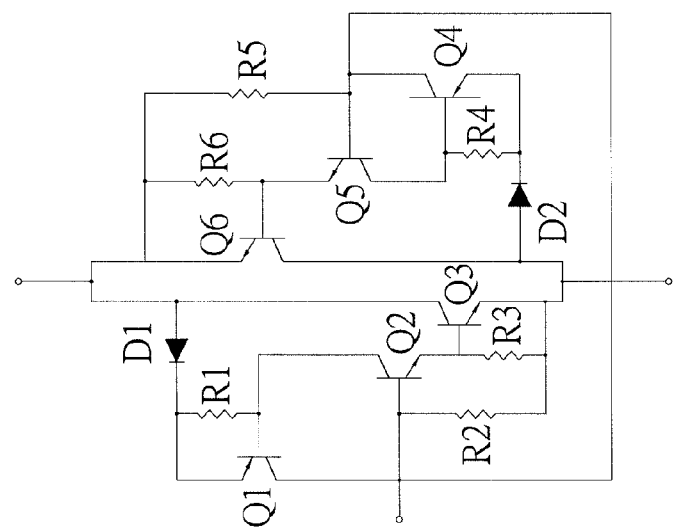
FIG. 8 is a circuit of a sixth preferred embodiment of the present invention.

The sixth preferred embodiment which is based on the fifth preferred embodiment is shown in FIG. 8, wherein it further includes six resistors R1-R6 to perform the same function as the fifth preferred embodiment.

In summary, the switches provided in the present invention are able to replace conventional SCRs and TRIACs, and it is not necessary to provide a pseudo loading circuit to a connected loading in purpose of maintaining the consumed current higher than a holding current, which effectively reduces energy consumption. In addition, by adopting small signal transistor to form latch circuits, the current of the control signals which inputted to trigger the switching members is lowered, and therefore current amplifier circuit can be omitted, which further saves the manufacturing cost. The transistors in the aforementioned embodiments are bipolar junction transistors; however, other types of transistors, such as MOSFET, can be also adopted in practice.

It must be pointed out that the embodiments described above are only some preferred embodiments of the present invention. All equivalent structures which employ the concepts disclosed in this specification and the appended claims should fall within the scope of the present invention.

What is claimed is:

1. A switch, which is provided between a power source and a loading, comprising:
   a first switching member having a first terminal, a second terminal, and a control terminal, wherein the first terminal is electrically connected to the power source, and the second terminal is electrically connected to the loading; the control terminal controls conduction between the first terminal and the second terminal; and
   a latch circuit including a first transistor and a second transistor which are electrically connected to each other, wherein the first transistor is electrically connected to the first terminal of the first switching member, and the second transistor is electrically connected to the control terminal of the first switching member;
   wherein, when a trigger voltage is provided to the second transistor, the second transistor and the first switching member are conducted to make the first transistor conductive; after the first transistor becoming conductive, the first transistor provides electricity to the second transistor, which keeps the second transistor conductive.

2. The switch of claim 1, wherein the first transistor and the second transistor are bipolar junction transistors.

3. The switch of claim 2, wherein the first transistor is a PNP bipolar junction transistor, and the second transistor is a NPN bipolar junction transistor; an emitter of the first transistor is electrically connected to the first terminal of the first switching member, a base of the first transistor is electrically connected to a collector of the second transistor, a collector of the first transistor is electrically connected to a base of the second transistor, and an emitter of the second transistor is electrically connected to the control terminal of the first switching member; when the power source provides positive voltage and inputs the trigger voltage to the base of the second transistor, the second transistor and the first switching member are conducted.

4. The switch of claim 3, wherein the first switching member is a third transistor, which is a NPN bipolar junction transistor; a collector of the third transistor is the first terminal, an emitter of the third transistor is the second terminal, a base of the third transistor is the control terminal of the first switching member; the trigger voltage is higher than or equal to a total amount of voltage at the bases and the emitters of the second transistor and the third transistor.

5. The switch of claim 3, wherein the first switching member is a silicon controlled rectifier (SCR); an anode of the SCR is the first terminal, a cathode of the SCR is the second terminal, and a gate of the SCR is the control terminal of the first switching member.

6. The switch of claim 1, further comprising a second switching member having a first terminal, a second terminal, and a control terminal, wherein the first terminal thereof is electrically connected to the second terminal of the first switching member, the second terminal thereof is electrically connected to the first terminal of the first switching member, and the control terminal thereof controls conduction of the second switching member; the latch circuit further comprises a fourth transistor and a fifth transistor which are electrically connected to each other; the fourth transistor is electrically connected to the first terminal of the second switching member, and the fifth transistor is electrically connected to the control terminal of the second switching member and the fourth transistor; when the power source provides positive voltage and inputs the trigger voltage to the second transistor, the second transistor and the first switching member are conducted; when the power source provides negative voltage and inputs the trigger voltage to the second transistor, the fifth transistor and the second switching member are conducted to make the fourth transistor become conductive, and after the fourth transistor becoming conducted, the fourth transistor provides electricity to the fifth transistor to keep the fifth transistor conductive.

7. The switch of claim 6, wherein the latch circuit further comprises a first diode and second diode; an anode of the first diode is electrically connected to the first terminal of the first switching member, and an cathode of the first diode is electrically connected to the first transistor; an anode of the second diode is electrically connected to the first terminal of the second switching member, and an cathode of the second diode is electrically connected to the fourth transistor.

8. The switch of claim 7, wherein the first transistor, the second transistor, the fourth transistor, and the fifth transistor are bipolar junction transistors.

9. The switch of claim 8, wherein the first transistor is a PNP bipolar junction transistor, the second transistor is a NPN bipolar junction transistor; the emitter of the first transistor is electrically connected to the cathode of the first diode, the base of the first transistor is electrically connected to the collector of the second transistor, the collector of the first transistor is electrically connected to the base of the second transistor, and the emitter of the second transistor is electrically connected to the control terminal of the first switching member; the base of the second transistor accepts the trigger voltage; the fourth transistor is a PNP bipolar junction transistor, and the fifth transistor is a NPN bipolar junction transistor; an emitter of the fourth transistor is electrically connected to the cathode of the second diode, a base of the fourth transistor is electrically connected to a collector of the fifth transistor, a collector the fourth transistor is electrically connected to a base of the fifth transistor and the base of the second transistor, an emitter of the fifth transistor is electrically connected to the control terminal of the second switching member.

10. The switch of claim 9, wherein the first switching member is a third transistor, and the second switching member is a sixth transistor; the third transistor and the sixth transistor are NPN bipolar junction transistors; a collector of the third transistor is the first terminal, an emitter of the third transistor is the second terminal, and a base of the third transistor is the control terminal of the first switching member; a collector of the sixth transistor is the first terminal, an emitter of the sixth transistor is the second terminal, and a base of the sixth transistor is the control terminal of the second switching member; the trigger voltage is larger than or equal to a total amount of voltage at the bases and the emitters of the second transistor and the third transistor, and the trigger voltage is larger than or equal to a total amount of voltage at the bases and the emitters of the fifth transistor and the sixth transistor.

\* \* \* \* \*